United States Patent
Ngo

(10) Patent No.: US 7,634,713 B1
(45) Date of Patent: Dec. 15, 2009

(54) ERROR DETECTION AND LOCATION CIRCUITRY FOR CONFIGURATION RANDOM-ACCESS MEMORY

(75) Inventor: Ninh D. Ngo, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 662 days.

(21) Appl. No.: 11/435,467

(22) Filed: May 16, 2006

(51) Int. Cl.
*H03M 13/00* (2006.01)
*G11C 29/00* (2006.01)
*G01R 31/28* (2006.01)

(52) U.S. Cl. .................. 714/781; 714/718; 714/736
(58) Field of Classification Search .................. 714/746, 714/785, 724, 725, 753, 758, 780, 781, 807, 714/3
See application file for complete search history.

(56) References Cited

U.S. PATENT DOCUMENTS

| | | | |
|---|---|---|---|
| 6,104,211 A | 8/2000 | Alfke | |
| 6,191,614 B1 | 2/2001 | Schultz et al. | |
| 6,237,124 B1 | 5/2001 | Plants | |
| 6,429,682 B1 * | 8/2002 | Schultz et al. | 326/41 |
| 7,036,059 B1 | 4/2006 | Carmichael et al. | |
| 7,099,190 B2 * | 8/2006 | Noguchi et al. | 365/185.09 |
| 7,453,728 B2 * | 11/2008 | Noguchi et al. | 365/185.09 |
| 2004/0061060 A1 | 4/2004 | Layman et al. | |

OTHER PUBLICATIONS

Lewis et al. U.S. Appl. No. 60/793,946.

* cited by examiner

*Primary Examiner*—Phung M Chung
(74) *Attorney, Agent, or Firm*—Treyz Law Group; G. Victor Treyz

(57) ABSTRACT

Error detection and error location determination circuitry is provided for detecting and locating soft errors in random-access-memory arrays on programmable integrated circuits. The random-access-memory arrays contain rows and columns of random-access-memory cells. Some of the cells are loaded with configuration data and produce static output signals that are used to program associated regions of programmable logic. Cyclic redundancy check error correction check bits are computed for each column of each array. The error correction check bits are stored in corresponding columns of cells in the array. During normal operation of an integrated circuit in a system, the cells are subject to soft errors caused by background radiation strikes. The error detection and error location determination circuitry contains linear feedback shift register circuitry that processes columns of array data. The circuitry continuously processes the data to identify the row and column location of each error.

20 Claims, 11 Drawing Sheets

ERROR DETECTION AND LOCATION CIRCUITRY FOR CONFIGURATION RANDOM-ACCESS MEMORY

BACKGROUND

This invention relates to integrated circuits such as programmable logic device integrated circuits, and more particularly, to circuitry for detecting and locating soft errors in integrated circuits.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into programmable logic device memory elements to configure the devices to perform the functions of the custom logic circuit.

Programmable logic device memory elements are often based on random-access-memory (RAM) cells. Because the RAM cells are loaded with configuration data during device programming, the RAM cells are sometimes referred to as configuration memory or configuration random-access-memory cells (CRAM).

During normal operation of a programmable logic device, loaded CRAM cells produce static output signals that are applied to the gates of metal-oxide-semiconductor (MOS) field-effect transistors (e.g., pass transistors). The CRAM output signals turn some transistors on and turn other transistors off. This selective activation of certain transistors on the device customizes the operation of the device so that the device performs its intended function.

When operating in a system, programmable logic devices are subject to environmental background radiation. Particularly in modern programmable logic devices that contain large numbers of CRAM cells, there is a possibility that a radiation strike on a CRAM cell will cause the CRAM cell to change its state. For example, a CRAM cell storing a "one" configuration bit may flip its state so that the cell erroneously stores a "zero" bit. When a CRAM cell changes state, the transistor being controlled by that CRAM cell will be placed into an erroneous state. The transistor might, for example, be turned on when it should have been turned off.

Radiation-induced errors that arise in configuration random-access-memory cells are sometimes referred to as soft errors. One way in which soft errors can be addressed is to change the design of the configuration random-access-memory cells. However, changes to the configuration random-access-memory cells can introduce undesired circuit complexity and can consume additional circuit real estate. As a result, it is often necessary to use a configuration random-access-memory cell architecture that occasionally produces soft errors.

Conventional programmable logic devices include error detection circuitry that continuously monitors an entire array of configuration random-access-memory cells. If an error is detected in the array, an error flag may be set. Systems that require highly reliable operations can monitor the status of the error flag to determine whether the programmable logic device has experienced any soft errors. So long as no errors are present, the system allows the programmable logic device to operate normally. If, however, the state of the error flag indicates that one of the configuration random-access-memory cells on the device has exhibited a soft error, the system can reconfigure the device by reloading the original configuration data into the configuration random-access-memory cells.

Because most soft errors do not produce permanent circuit damage, the process of reloading the original configuration data into a programmable logic device that has experienced a soft error is generally successful in restoring normal system operation. However, the reloading process can be disruptive to system operations, particularly when the programmable logic device is being used in a sensitive system in which fault-free operation is desired.

In some situations, soft errors in CRAM cells do not disrupt device operation. For example, a soft error in a CRAM cell that is not being used to implement part of a user's logic design may not adversely affect the normal operation of a device. With conventional programmable logic devices it is generally not possible to determine whether or not critical circuitry will be affected by a soft error, because conventional error detection circuitry is unable to determine the location of the soft error.

It would therefore be desirable to be able to provide integrated circuits such as programmable logic device integrated circuits with circuitry for detecting and locating soft errors in configuration random-access-memory.

SUMMARY

In accordance with the present invention, integrated circuits such as programmable logic device integrated circuits are provided with error detection and error location determination circuitry. The error detection and error location determination circuitry continuously monitors the configuration random-access-memory cells. If an error is detected, the error detection and error location determination circuitry determines the location of the error. The location is preferably determined at the bit level. With this type of arrangement, the row and column of a random-access-memory cell array that contains a detected soft error can be identified. Identifying the bit position of soft errors allows error control logic to take appropriate actions such as reloading an original set of configuration data into the configuration random-access-memory cells or, if possible, foregoing the reloading process to avoid disrupting operation of the integrated circuit.

Each programmable logic device contains an array of random-access-memory cells. Each array contains rows and columns of configuration random-access-memory cells that are used for storing configuration data and contains rows and columns of error-correction-code cells that are used for storing corresponding error-correction-code data. The error-correction-code data may be, for example, 16-bit cyclic redundancy check words.

Columns of the array form data frames. The error detection and error location determination circuitry processes each frame of data to determine whether a soft error has occurred. The error detection and error location determination circuitry contains linear feedback shift register circuitry, pattern detection circuitry, and counter circuitry. If an error is detected, a detected error signal may be taken high. If the bit position of an error within a frame is determined, a multi-bit location signal may be generated that indicates the error's location within the frame. Information on which frame contains the error may also be provided in the form of a multi-bit signal. Taken together, the multi-bit location signals provide sufficient information to locate detected soft errors by their bit position in the array (i.e., by row and column).

Further features of the invention, its nature and various advantages will be more apparent from the accompanying drawings and the following detailed description of the preferred embodiments.

DETAILED DESCRIPTION

Figure 1:
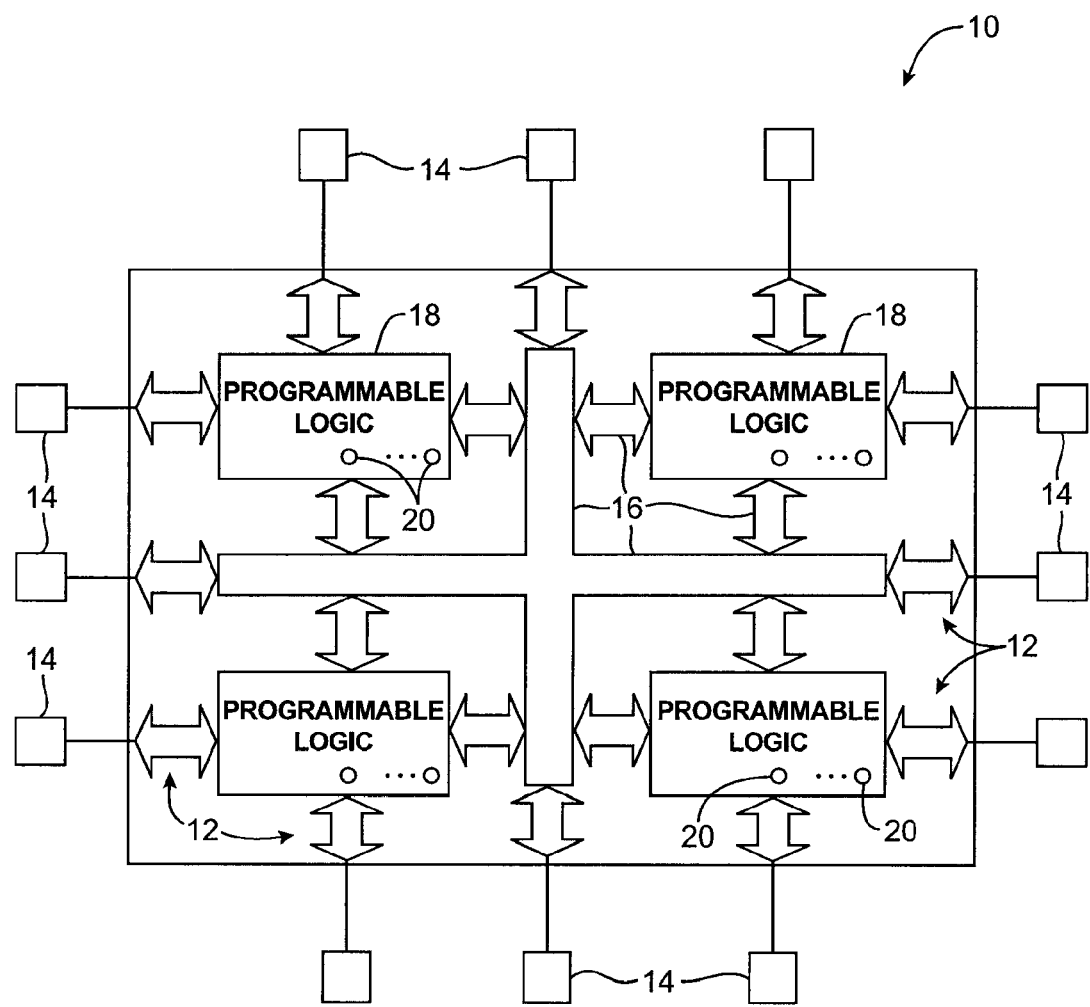
FIG. 1 is a diagram of an illustrative programmable logic device in accordance with the present invention.

The present invention relates to integrated circuits containing circuitry for detecting and locating soft errors in volatile memory elements. The integrated circuits contain programmable circuitry. The programmable circuitry is programmed to perform a custom function by loading configuration data into the volatile memory elements. With one suitable configuration, the volatile memory elements are random-access-memory (RAM) cells.

The integrated circuits used with the present invention may be programmable logic device integrated circuits or programmable integrated circuits that contain programmable circuitry but that are not typically referred to as programmable logic devices. For example, the invention may be used with digital signal processing circuits containing volatile memory elements and programmable circuitry, microprocessors containing volatile memory elements and programmable circuitry, application specific integrated circuits containing volatile memory elements and programmable circuitry, or any other suitable integrated circuit. The present invention will generally be described in the context of programmable logic device integrated circuits and programmable logic device random-access-memory cells that are loaded with configuration data as an example.

In a typical scenario, a programmable logic device integrated circuit is loaded with configuration data to customize the device. The configuration data is loaded into random-access-memory (RAM) cells, which are sometimes referred to as configuration random-access-memory (CRAM) cells. The CRAM cells are generally arranged in an array having numerous rows and columns. Modern programmable logic devices may contain CRAM arrays with thousands or millions of CRAM cells. The columns of a memory cell array are typically referred to as frames. A frame may contain any suitable number of CRAM cells. For example, a frame may contain 6000 CRAM cells. If background radiation causes the state of any of the 6000 CRAM cells that are in use to flip, the operation of the programmable logic device may be disrupted.

To ensure proper detection and location of CRAM soft errors, an additional array of random-access-memory cells is included on the programmable logic device. During configuration data loading operations, error correction check bits are computed for each frame of configuration data. The error correction check bits are stored in the additional array of RAM cells. Because the additional RAM cells are used to store error correction check bits, the RAM cells are sometimes referred to as error-correction-code (ECC) RAM cells. Similarly, the additional array of RAM cells is sometimes referred to as the ECC RAM array or ECC array. The ECC RAM cells and CRAM cells may be fabricated as a unitary array.

After the configuration data has been loaded onto the programmable logic device, the programmable logic device can be used in a system. During normal operations, each CRAM cell produces a static output signal that controls an associated component in the programmable logic of the programmable logic device and configures the programmable logic device to implement a desired custom logic function.

While the programmable logic device is operating normally, circuitry on the device monitors the status of the configuration data. If a soft error is detected, the circuitry locates the position of the error within the CRAM array. With one suitable approach, the exact bit position of the CRAM cell that contains the error is determined (i.e., the row and column of the faulty CRAM cell is located within the CRAM array). The location of the soft error can be used to help determine a suitable error handling response. For example, a user may implement user logic on the programmable logic device that processes the error location information. If the user logic or external logic in the system determines that the error has occurred in a non-critical portion of the CRAM array, the programmable logic device may be allowed to continue its normal operation uninterrupted. The non-critical portion of the array may be, for example, a portion of the array that contains all zeros or all ones (i.e., unused CRAM bits). If it is determined that the CRAM error has occurred in a portion of the CRAM array that contains actively used CRAM bits, the error may be corrected by reloading some or all of the original configuration data into the programmable logic device.

Any suitable type of error correction coding technique may be used in calculating the error correction check bits for the configuration data. With one suitable arrangement, which is described as an example, error correction coding operations are performed using the well-known cyclic redundancy code (CRC) error coding technique. This is merely illustrative. Any suitable error coding technique may be used if desired.

CRC error coding is performed using a CRC computation engine. During configuration data loading operations, CRC error correction check bits are computed using portions of the CRAM array. With one suitable approach, a separate set of CRC error correction check bits is computed for each column of the RAM array. The CRC check bits corresponding to each column of CRAM bits may be stored in the same column of the corresponding ECC RAM array (i.e., as part of a frame that contains the corresponding column of CRAM data). The CRC check bits provide coverage for all of the bits in the frame including the CRAM bits and the CRC bits.

During normal operation of the programmable logic device, error detection and error location determination circuitry systematically examines the contents of the RAM array. Processing is performed on a frame-by-frame basis. If no soft errors are present in a frame, processing can continue to a subsequent frame. Once all frames have been checked successfully, processing can loop back to the initial frame. The checking process can take place continuously, so that errors are detected quickly.

When the error detection and error location determination circuitry determines that an error has occurred, the error detection and error location determination circuitry attempts to locate the error. During location processing, the frame of data being processed is shifted through the error detection and error location determination circuitry. Upon successful completion of error location processing, the error detection and error location determination circuitry produces an error location signal. The number of bits in the error location signal depends on the size of the frame. If, for example, each frame in the CRAM array contains 6000 CRAM bits, the error location signal may be provided in the form of a thirteen-bit digital signal. The location signal from the error detection and error location determination circuitry identifies the row of the array containing the error. A multi-bit signal specifying the frame that contains the error is used to identify the column that contains the error. If error location processing is unsuccessful, the error detection and error location determination circuitry may produce output signals that indicate that no valid location was identified.

The error detection and error location determination circuitry may be implemented using any suitable architecture. For example, the error detection and error location determination may use a serial processing architecture based on a shift register. With this type of approach, the error detection and error location determination circuitry may be implemented using linear feedback shift register (LFSR) circuit blocks.

During error location processing, the configuration data and CRC data are shifted through the LFSR circuitry. The LFSR circuitry produces an output signal pattern. After a frame has been loaded, the output pattern from the LFSR circuitry is compared to a predefined pattern using further shifting operations. If there is no match between the LFSR output pattern and the predefined pattern, it is not possible to determine the location of the error. If, however, the output pattern from the LFSR circuitry matches the predefined pattern, the error detection and error location determination circuitry produces a valid location signal at its output.

The location signal that is produced by the error detection and error location determination circuitry can be used to take appropriate corrective actions. In general, any suitable actions may be taken when an error is detected and located. For example, the location of the CRAM error can be compared to the known locations of programmed CRAM bits. If the CRAM error has occurred in an unused portion of the CRAM array, the device may be allowed to function normally. If the CRAM error is located within a portion of the CRAM array that contains configuration data, the CRAM data that was originally loaded into the programmable logic device may be reloaded into the device. These are merely illustrative error-handling actions that may be taken when a CRAM error is located. In general, any suitable actions may be taken.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains memory cells 20 that can be loaded with configuration data using pins 14 and input/output circuitry 12. Loaded CRAM cells 20 each provide a corresponding static control output signal that controls the state of an associated logic component in programmable logic 18. The output signals are typically applied to the gates of metal-oxide-semiconductor (MOS) transistors.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
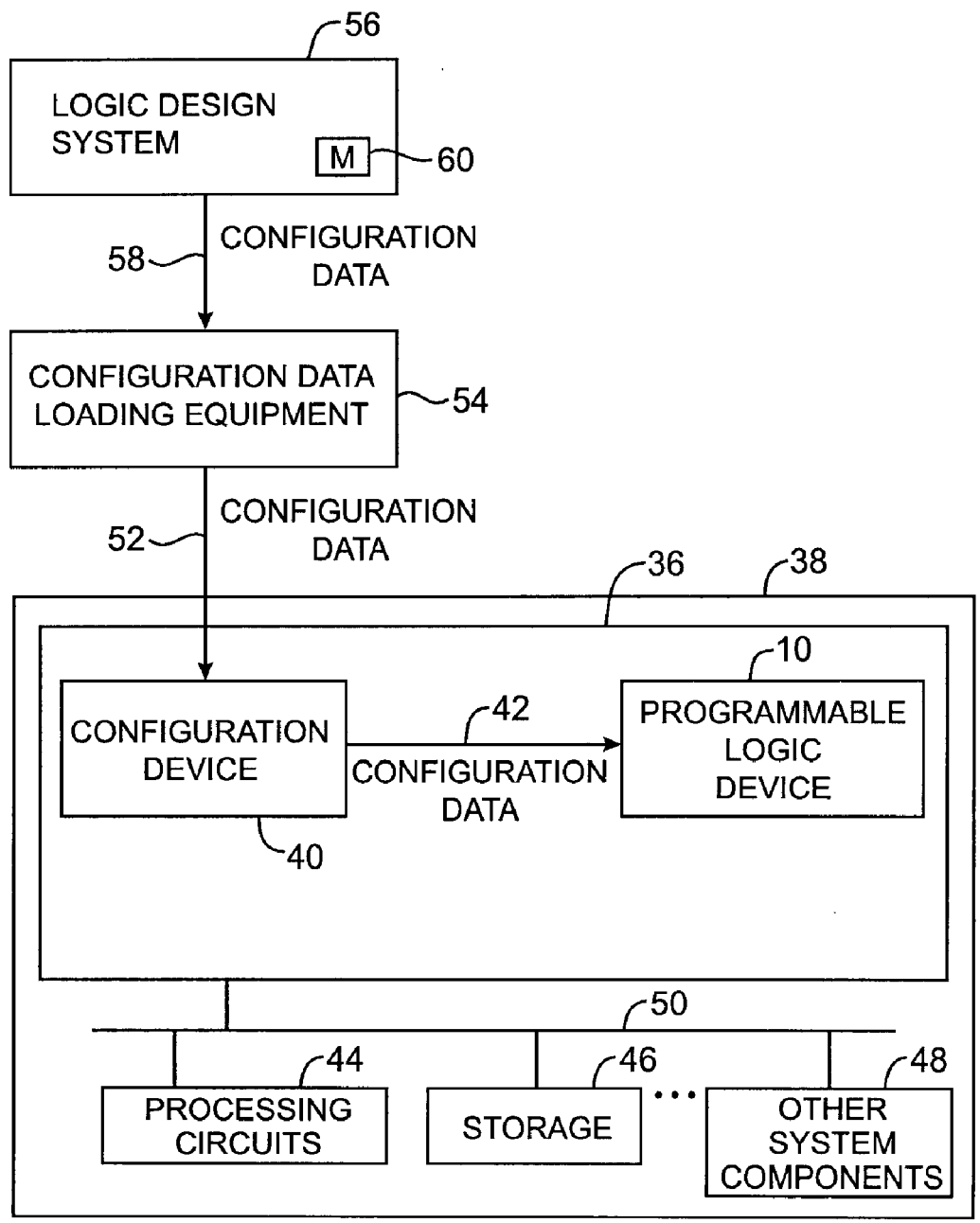
FIG. 2 is a diagram showing how programmable logic device configuration data is created by a logic design system and loaded into a programmable logic device to configure the device for operation in a system in accordance with the present invention.

An illustrative system environment for a programmable logic device 10 is shown in FIG. 2. Programmable logic device 10 may be mounted on a board 36 in a system 38. In general, programmable logic device 10 may receive configuration data from programming equipment or from any other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. The circuit 40 may be an erasable-programmable read-only memory (EPROM) chip, a programmable logic device configuration data loading chip with built-in memory (sometimes referred to as a configuration device), or any other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into the CRAM cells 20 of device 10. Device 10 may then be used in normal operation of system 38.

Due to strikes from alpha particles and cosmic rays, the loaded CRAM cells are subject to soft errors. The change in state of even a single CRAM bit may disrupt the operation of device 10, so programmable logic devices that are used in critical applications typically have error detection circuitry. The error detection circuitry monitors the CRAM array for faults.

Figure 3:
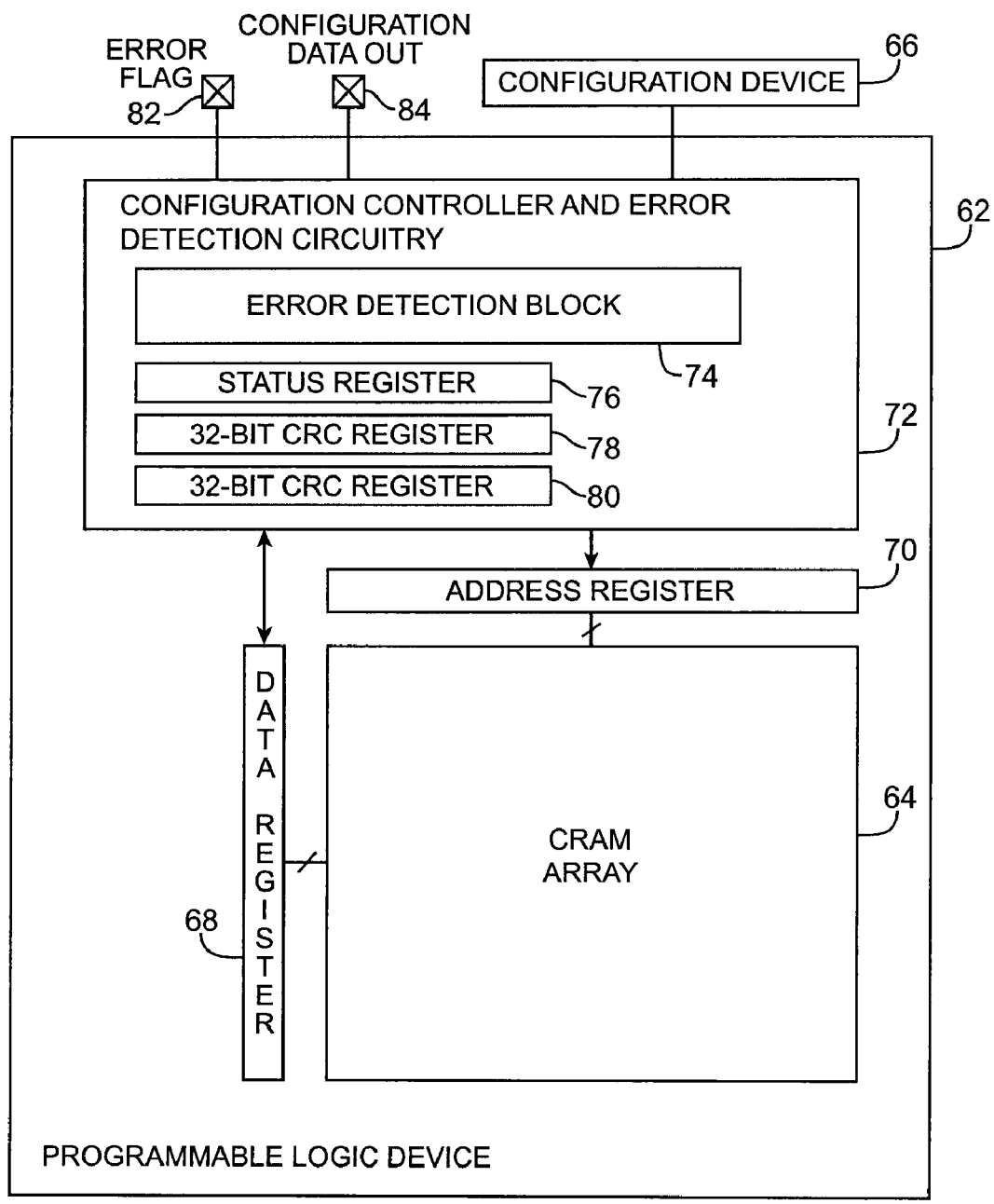
FIG. 3 is a diagram of a conventional programmable logic device integrated circuit containing error detection circuitry.

A conventional programmable logic device with error detection circuitry is shown in FIG. 3. As shown in FIG. 3, device 62 contains an array of configuration random-access-memory cells 64. CRAM array 64 is loaded with configuration data from configuration device 66. The cells of CRAM array 64 are addressed using address register 70 and data register 68. Configuration controller and error detection circuitry 72 controls configuration data loading operations. During loading operations, circuitry 72 computes a 32-bit cyclic-redundancy-check (CRC) code corresponding to the entire CRAM array 64. This CRC value is stored in register 78.

After data loading is complete, configuration controller and error detection circuitry 72 can confirm that the configuration data has been properly loaded by reading back the loaded configuration data. Configuration data may be read out of array 64 via configuration data out pin 84. Following successful programming of device 62, device 62 is used in a system.

During normal operation in a system, device 62 uses error detection block 74 to monitor CRAM array 64 for soft errors (if monitoring is enabled). Error detection block 74 continuously computes new values of the 32-bit CRC code for CRAM array 64 and stores the newly-computed CRC result in register 80. Block 74 compares the stored CRC value in register 78 to the newly-computed CRC value in register 80. If the CRC for the original CRAM data and the newly-computed CRC do not match, circuitry 72 can conclude that an error has occurred in CRAM array 64 and can take appropriate action. For example, circuitry 72 can update error status information in status register 76. The contents of status register 76 may be monitored by circuitry on device 62. Circuitry 72 can also take an error flag to a high value, which external circuitry can monitor using pin 82.

Figure 4:
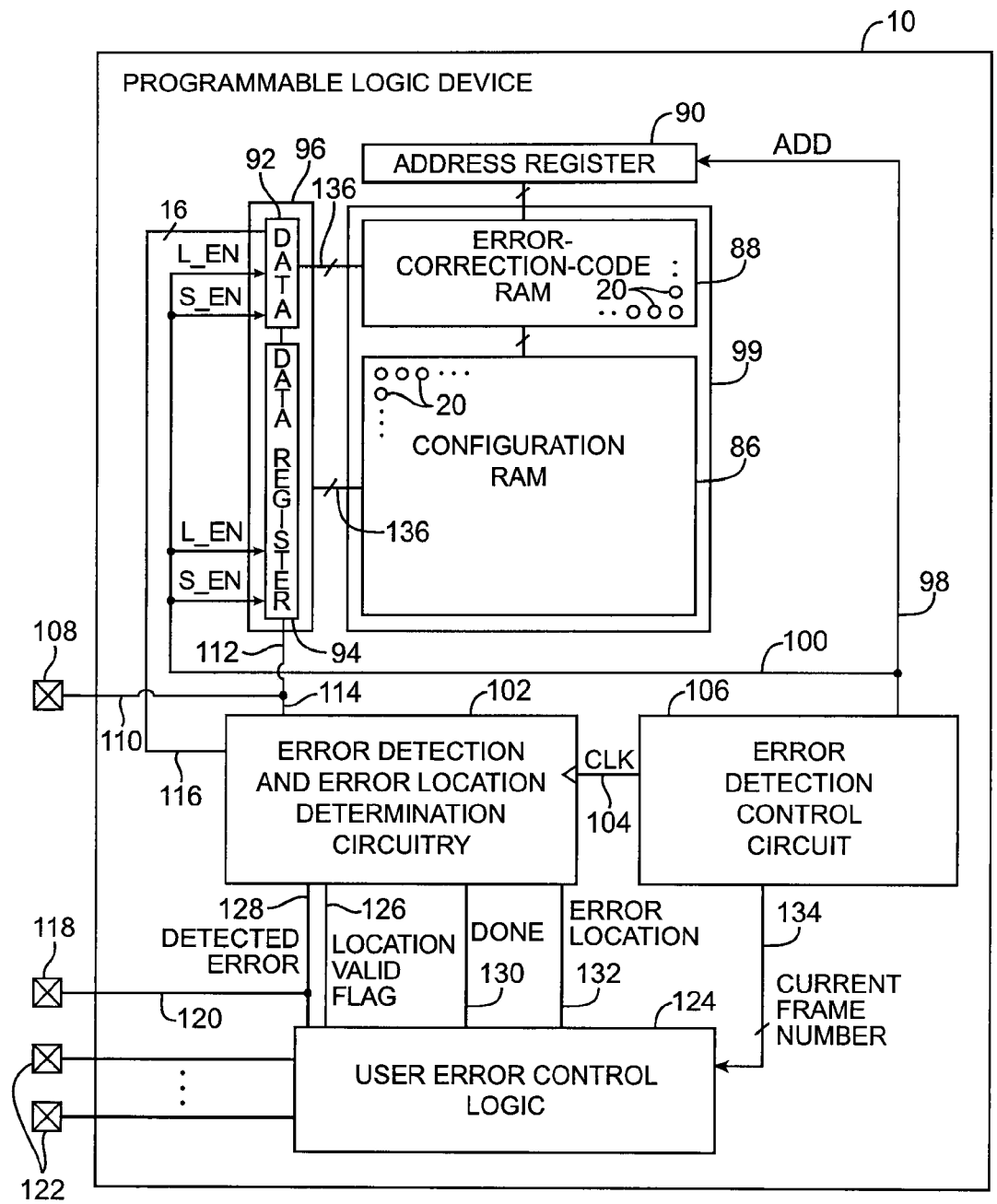
FIG. 4 is a diagram of a programmable logic device integrated circuit containing error detection and error location determination circuitry in accordance with the present invention.

A programmable logic device integrated circuit 10 with error detection and error location determination capabilities in accordance with the present invention is shown in FIG. 4. Programmable logic device 10 has an array 99 of random-access-memory cells 20. The RAM array 99 contains a CRAM array 86 an error-correction-code (ECC) RAM array 88. Array 86 is used to store configuration data. The outputs of the memory cells in array 86 are applied to the gates of transistors on device 10 to configure device 10 to perform its desired custom logic function. Array 88 is used to store error-correction-code data for array 86.

In general, any suitable error correction coding technique may be used in device 10. The use of a cyclic redundancy check (CRC) error correction coding arrangement is described as an example.

Error correction check bits such as CRC code check bits are computed for multiple subsets of the CRAM data in array 86. This provides the error detection and error location determination circuitry 102 with sufficient information to extract error location information from the data in array 99 when a fault is detected. The subsets of data that are processed may have any suitable size. With one suitable arrangement, data is processed in frames and each column of RAM array 99 forms a frame. The sizes used for arrays 86 and 88 depend on the complexity of device 10 and the strength of the error correction code algorithm that is used.

As an example, consider the situation in which array 86 contains 6000 rows and thousands of columns and in which a CRC-16 error correcting code algorithm is used to compute the error correction check bits for array 88. In this scenario, each column of configuration data in array 86 contains 6000 configuration bits. Each frame in array 99 contains a column of CRAM bits and a column of CRC bits. For example, the sixth frame of array 99 contains the sixth column of 6000 CRAM bits from array 86 and the sixth column of 16 CRC bits from array 88.

Data is loaded into and read from array 99 using address register 90 and data register 96. Data register 96 contains two serially-connected data registers 92 and 94. Data register 92 is used to access array 88. Data register 94 is used to access data array 86. During data loading operations, the signal ADD on path 98 and register 90 are used to systematically assert various address lines in the columns of array 99. As each column of array 99 is addressed, data from data register 96 is shifted into that column over paths 136. Configuration data is loaded into data register 94 using data loading circuitry, shown schematically in FIG. 4 by pin 108, path 110, and path 112. As each frame of configuration data is loaded into data register 94, error detection and error location determination circuitry 102 computes a 16-bit CRC word for that frame and loads the 16-bit CRC word into data register 92 via path 116. Loading operations are enabled by asserting the L_EN signal on path 100.

After each 6000-bit frame of configuration data has been loaded into register 94 and a corresponding 16 bits of CRC data have been loaded into register 92, the shift enable signal S_EN is asserted on path 100. This shifts the data from register 96 into the column of array 99 corresponding to the currently asserted address.

After the array 86 has been loaded with columns of configuration data and after the array 88 has been loaded with corresponding columns of CRC error correction check bits, the device 10 may be used in a system such as system 38 of FIG. 2. During normal operation, error detection and error location determination circuitry 102 continually monitors the data in array 99 for soft errors.

Data is read out from array 99 using address register 90 and data register 96. Error detection control circuit 106 uses path 98 and address register 90 to systematically assert column addresses for array 99. With one suitable approach, a single address bit is asserted at a time in sequence. Each time a column of array 99 is addressed, the shift enable signal S_EN is taken high by error detection control circuit 106 to shift the contents of that column into data register 96. The 16-bits of ECC RAM data in the addressed column are shifted into register 92. The 6000 bits of configuration data in the addressed column of array 86 are simultaneously shifted into register 94. Information on the location of the currently addressed column is provided on line 134 (e.g., in the form of a multi-bit signal). The circuitry of circuit 106 works in conjunction with the error detection and error location determination circuitry 102 and is therefore sometimes referred to as error determination and error location determination circuitry.

After each column of data is shifted out of array 99, error detection control circuit 106 takes the load enable signal L_EN high. The data in register 96 is then serially clocked out of register 96 into error detection and error location determination circuitry 102 via paths 112 and 114. The clock signal CLK is applied to error detection and error location determination circuitry 104 by error detection control circuit 106 using clock path 104. The clock signal CLK is also applied to the individual registers in register 96.

The data from register 96 is processed by error detection and error location determination circuitry 102. The data that is processed includes the column of configuration data that has been read back from array 86 and the CRC data that was previously computed for that column and stored in array 88. During processing, circuitry 102 detects whether a soft error has occurred in the frame. The location of the frame that contains the detected error within array 86 serves as a form of location information for the bit. For example, if an error is detected during processing of the second frame, the error detection and error location determination circuitry 102 and error detection control circuit 106, which maintains information on the current frame number, can conclude that the error is located in the second frame. Under many circumstances, error detection and error location determination circuitry 102 can further process the data from register 96 to determine the exact bit location of the error within the frame (e.g., cell number 3457 of the second frame).

Information on the detection of a soft error and error location information can be provided to other circuitry using any suitable scheme. With one suitable scheme, information on the current frame number being processed is provided by error detection control circuit 106 over path 134. Information on the location of the error is provided over path 132. Paths 132 and 134 may be implemented using parallel buses of appropriate widths. A thirteen-bit bus width is sufficient for path 132 to provide complete location information for a 6000-bit frame.

Paths such as paths 128, 126, and 130 can also be used to supply information on error status. The DETECTED ERROR signal on path 128 may be asserted (e.g., taken to a logic high value) whenever circuitry 102 detects a CRAM error. The LOCATION VALID FLAG signal on path 126 may be asserted whenever circuitry 102 has successfully determined the location of a detected error within a frame. When the signal on path 126 is asserted, the ERROR LOCATION signal on path 132 is valid. Path 130 may be used to provide a DONE signal. The signal DONE may be asserted when the circuitry 102 is finished processing a column of ECC and configuration data from array 99.

Error status signals such as these may be monitored by off-chip and on-chip logic. In the example shown in FIG. 4, the DETECTED ERROR signal on path 128 is provided to external circuitry using path 120 and pin 118. The signals on paths 126, 128, 130, 132, and 134 are monitored by error control logic 124. Error control logic 124 may be implemented using hardwired logic and/or user-programmed core logic on programmable logic device 10 (e.g., part of programmable logic 18 of FIG. 1). Control logic 124 may provide raw and processed signals to external components using pins such as pins 122.

Based on internal and/or external processing, a decision may be made about how to handle a detected error. The decision may be based at least in part on the location of the error. For example, if it is determined that the error has occurred within a portion of the configuration RAM array 86 that was not being used to actively configure a portion of the programmable logic 18 in the user's custom logic design, the error may be left uncorrected. This avoids disrupting the system 38 in which the programmable logic device 10 is operating. If, however, it is determined that a soft CRAM error has occurred in a portion of the CRAM array 86 that contains configuration data bits (or that contains important configuration data bits), appropriate corrective actions can be taken. Potential corrective actions that may be taken include reloading the original configuration data into array 86, reloading a portion of the configuration data into array 86, reloading different configuration data into all or some of array 86, asserting a system-level alarm flag, etc.

Figure 5:
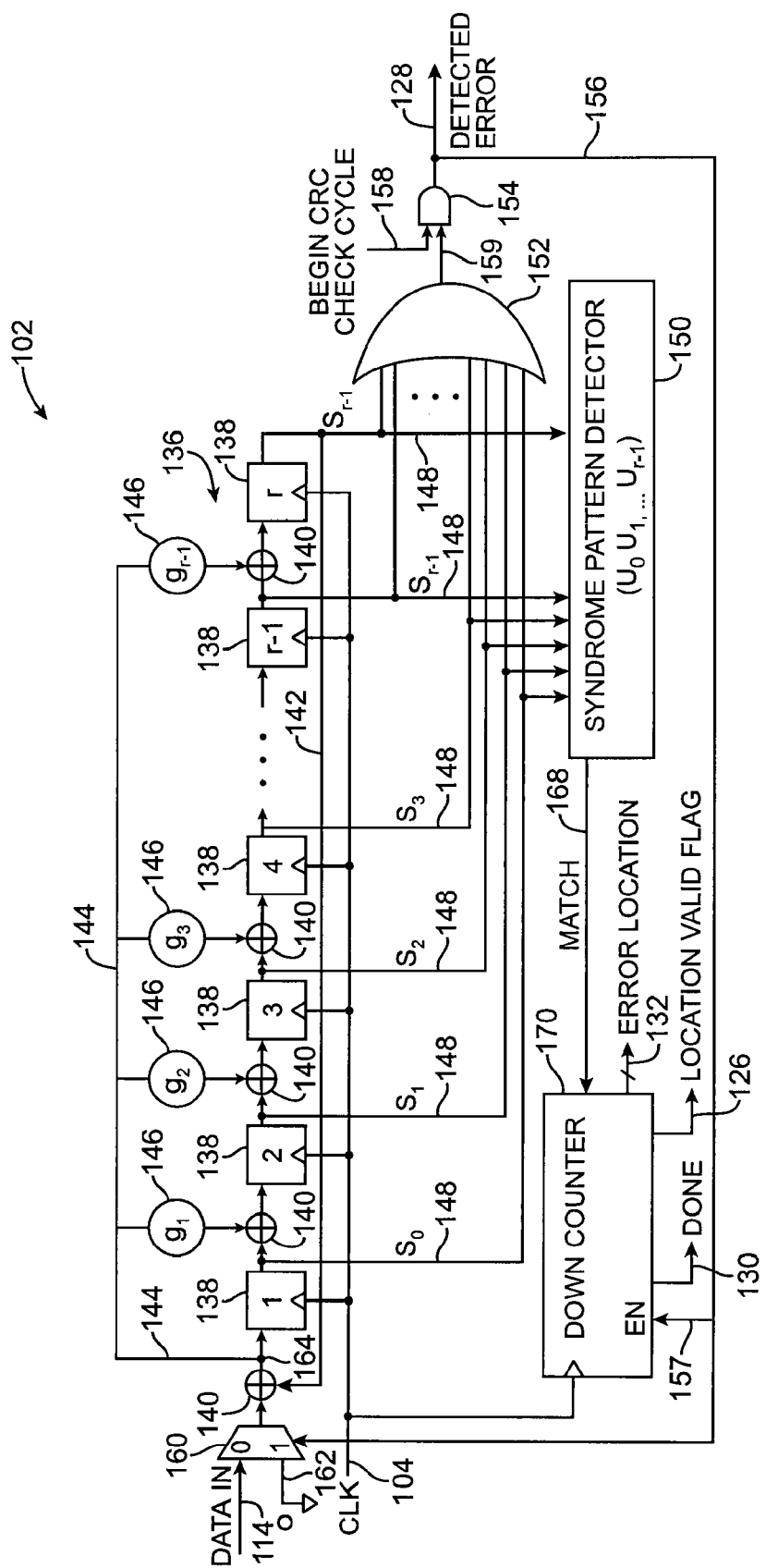
FIG. 5 is a circuit diagram of illustrative single-counter error detection and error location determination circuitry that may be used in a programmable logic device integrated circuit of the type shown in FIG. 4 in accordance with the present invention.

The error detection and error location determination circuitry 102 may be implemented using a shift-register architecture of the type shown in FIG. 5. The circuitry of FIG. 5 is based on a CRC error correction code arrangement. As shown in FIG. 5, error detection and error location determination circuitry 102 contains a linear feedback shift register (LFSR) circuit 136. LFSR circuit 136 contains a series of registers 138. Registers 138 may be, for example edge-triggered DQ flip flops. Registers 138 receive clocks signal CLK from input 104. Exclusive OR gates 140 are placed between each pair of registers. There are r registers 138 in circuit 136, where r corresponds to the strength of the CRC algorithm being used (i.e., r=16 for 16-bit CRC). A feedback path 142 connects the output of the last register 138 (i.e., register r) with the first gate 140. Paths 144 convey signals from node 164 to the inputs of various exclusive OR gates 140 via connections 146.

Some of connections 146 form open circuits and some of connections 146 form short circuits. The state of each connection 146 (i.e., whether open or shorted) is determined by the value of a corresponding CRC generator polynomial g(x).

As shown in FIG. 5, the connections 146 are labeled ($g_1$, $g_2$, $g_3$, ... $g_{r-1}$) and represent corresponding coefficients of the CRC generator polynomial g(x). In general, any suitable polynomial g(x) may be used, depending on the strength and type of CRC functionality that are desired.

An illustrative CRC polynomial g(x) that may be used for the circuitry of FIG. 5 is shown in equation 1.

$$g(x)=x^{16}+x^{15}+x^2+1 \qquad (1)$$

When the equation for g(x) that is shown in equation 1 is used in circuit 102, the value of $g_{15}$ and $g_2$ are 1. The other $\{g_i\}$ values are zero (the highest order and lowest order terms $g_{16}$ and $g_0$ are always present and as such represent special cases that are not used in determining the states of the connections 146).

Figure 6:
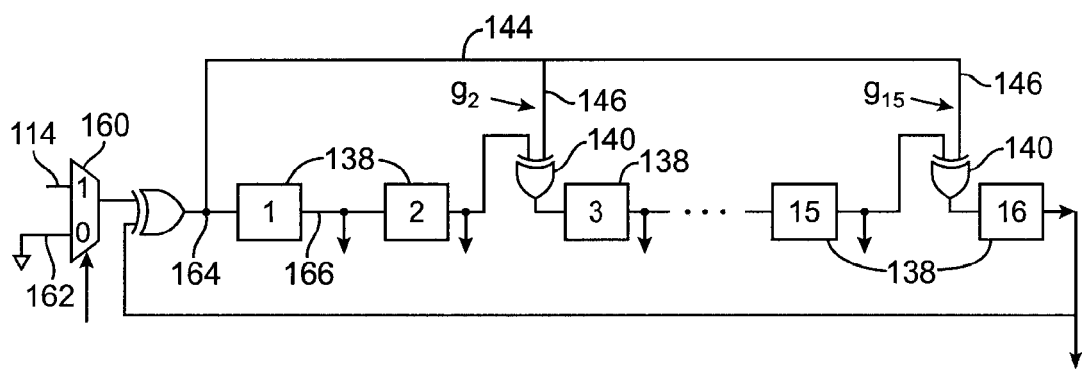
FIG. 6 is a diagram of illustrative linear feedback shift register circuitry that may be used in error detection and error location determination circuitry of the type shown in FIG. 5 in accordance with the present invention.

FIG. 6 shows the circuit implementation of LFSR circuit 136 of FIG. 5 when a g(x) polynomial of the type shown in equation 1 is used. As shown in FIG. 6, when a $g_i$ coefficient is not present in equation 1, there is a hardwired connection between a corresponding pair of registers and the exclusive OR gate associated with that pair of registers is omitted. For example, because there is no coefficient $g_1$ in equation 1 (i.e., $g_1$=0), there is a hardwired connection 166 between register 1 and register 2. When a $g_i$ coefficient in FIG. 6 is present, there is a hardwired path connecting path 144 to one of the two inputs to the exclusive OR gate. The other input to the exclusive OR gate is connected to the output of the preceding register. For example, the coefficient $g_2$ is present in equation 1 (i.e., there is a non-zero polynomial term $x^2$ in equation 1), so there is an exclusive OR gate between registers 2 and 3 that receives as one of its two inputs a signal from a corresponding connection 146 to path 144 (labeled $g_2$ in FIG. 6). The circuit diagram of FIG. 5 is generalized for any CRC generator polynomial g(x). The circuit example of FIG. 6 corresponds to the use of the CRC generator polynomial g(x) of equation 1.

As shown in FIG. 5, the registers 138 produce a corresponding set of outputs $\{s_i\}$ on output lines 148 that are collectively referred to as the CRC syndrome s. The syndrome s is applied to the inputs of OR gate 152 and the inputs of syndrome pattern detector 150. The output of OR gate 152 is provided to a first input 159 of AND gate 154. A second input 158 to AND gate 154 receives an enable signal that is taken high when it is desired to begin an error detection cycle (i.e., after a frame has been completely loaded). When enabled, AND gate 154 provides a signal on its output called DETECTED ERROR. The signal DETECTED error is low when the signals $\{s_i\}$ are low. If any of the signals $\{s_i\}$ go high, the signal DETECTED ERROR goes high.

The signal DETECTED ERROR is fed back to the control input to input multiplexer 160 via path 156. While DETECTED ERROR is low, multiplexer 160 connects its DATA IN input 114 to its output and a low enable signal is provided to down counter circuit 170 via line 157. This allows the frame of configuration data and error correction bits from register 96 to be shifted to into LFSR circuit 136. As soon as DETECTED ERROR goes high, down counter 170 is enabled via path 157 and the multiplexer 160 connects its grounded input 162 to its output. The grounded input 162 provides a source of logic zeros to the LFSR circuit 136 and is therefore sometimes referred to as the "zero input" of multiplexer 160. The zero input of multiplexer 160 remains connected to the output of multiplexer 160 for the remainder of the processing operations for the current frame. This shifts logic zeros into the LFSR circuit 136.

During the shifting operations of LFSR circuit 136 after the signal BEGIN CRC CHECK CYCLE on line 158 has been taken high, syndrome pattern detector 150 continuously monitors the syndrome signals $\{s_i\}$ at its inputs and compares these signals to a predefined pattern of signals $\{u_i\}$. If the monitored syndrome matches the predefined pattern, the error detection and error location determination circuit 102 can conclude that an error has been located. In this situation, the signal MATCH on line 164 is taken high. Down counter 170 maintains a count (called DOWN COUNT) as bits are shifted through LFSR circuit 136. When the down counter 170 senses that MATCH has gone high, counting is stopped and a valid ERROR LOCATION signal is provided on output line 132. The down counter also sets the signal DONE on line 130 to a high value to indicate that processing is complete. The signal LOCATION VALID FLAG on line 126 is taken high to indicate that the ERROR LOCATION signal is valid and can be used with the correct frame number error location signal on path 134 of FIG. 4 to determine an appropriate action to take in response to the detected error.

Figure 7:
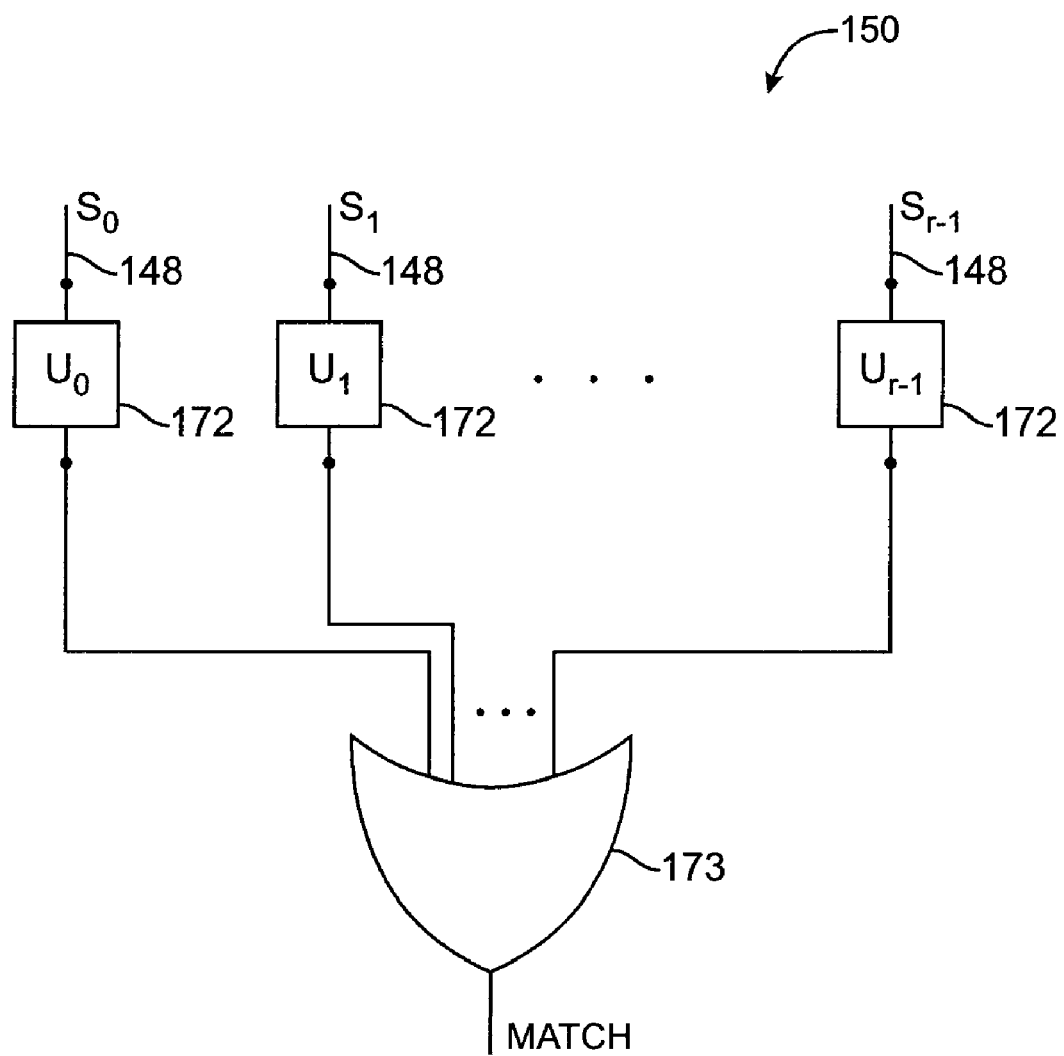
FIG. 7 is a generalized diagram of illustrative pattern detection circuitry that may be used in error detection and error location determination circuitry of the type shown in FIG. 5 in accordance with the present invention.

The syndrome pattern detector may use a circuit of the type shown in FIG. 7 to generate the MATCH signal. In FIG. 7, the boxes 172 are labeled with coefficients $\{u_i\}$. The coefficients $\{u_i\}$ represent the pattern being detected. The $\{u_i\}$ correspond to the terms of the remainder polynomial u(x) produced by the division of equation 2.

$$u(x)=x^{r+y} \bmod g(x) \qquad (2)$$

In equation 2, g(x) is the CRC generator polynomial (e.g., the generator polynomial of equation 1). The value of r is determined by the CRC strength (e.g., r=16 for CRC-16). The value of y is given by the number of bits in register 96 (i.e., the number of bits in a frame including the configuration data bits from a given column of CRAM array 86 and the ECC RAM bits from the same given column of ECC RAM array 88).

Using equation 2, a set of $\{u_i\}$ are produced corresponding to the terms present in the function u(x). For example, if u(x) contains a term $x^w$, then $u_w$=1. If u(x) does not contain the term $x^w$, then $u_w$=0. In the circuit of FIG. 7, each box 172 that corresponds to a "1" represents an inverter. Each box 172 that corresponds to a "0" represents a direct path (short circuit). The outputs of boxes 172 are provided to OR gate 173. If any of the outputs of boxes 172 are high, the syndrome signals $\{s_i\}$ and the predefined pattern $\{u_i\}$ are said to form a match. In this situation, the signal MATCH at the output of OR gate 173 goes high.

Figure 8:
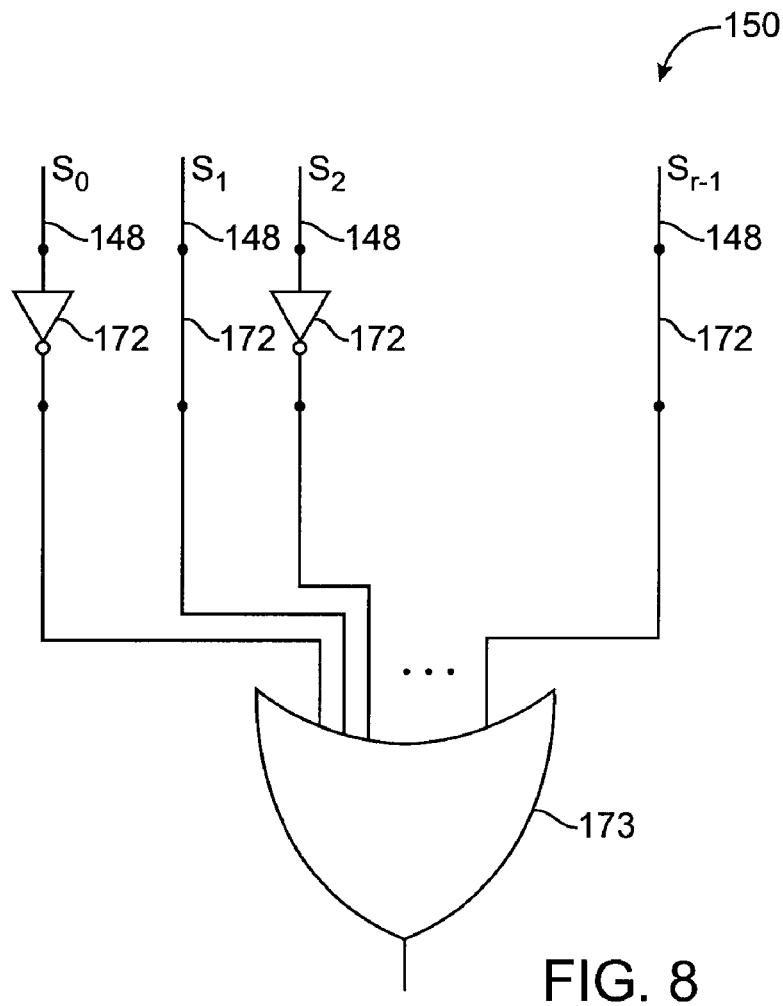
FIG. 8 is a more specific diagram of illustrative pattern detection circuitry that may be used in error detection and error location determination circuitry of the type shown in FIG. 5 in accordance with the present invention.
Figure 9:
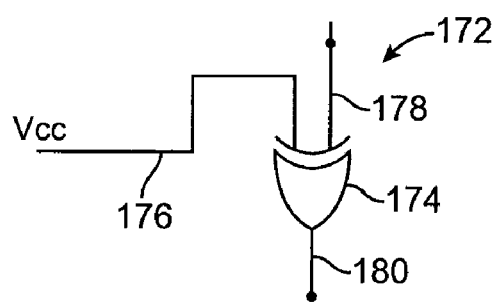
FIGS. 9 and 10 are diagrams of circuitry that may be used to implement different predefined patterns in pattern detection circuitry of the types shown in FIGS. 7 and 8 accordance with the present invention.
Figure 10:
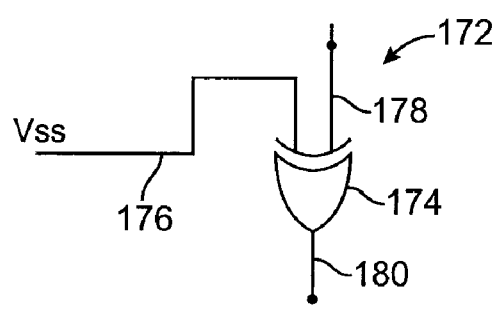

An example of a pattern detection circuit 150 in which the value of $u_0$ is 1, $u_1$ is 0, $u_2$ is 1, and $u_3$-$u_{r-1}$ are 0 is shown in FIG. 8. As shown in FIG. 8, elements 172 are formed using inverters or hardwired paths, as appropriate. A circuit layout for the circuit elements 172 may be custom designed for each programmable logic device integrated circuit in which a pattern detector 150 is desired. Alternatively, a layout-friendly approach may be used. This type of arrangement is illustrated in FIGS. 9 and 10. To avoid redesigning the circuit layout for elements 172 for each potentially new set of $\{u_i\}$, detector 150 uses circuit elements 172 based on exclusive OR gates 174. Exclusive OR gates 174 have one input 176 that is hardwired to either a logic high as shown in FIG. 9 or a logic low as shown in FIG. 10. Each exclusive OR gate 174 also has an input 178 that is connected to a respective one of the syndrome inputs 148. When it is desired to use a given element 172 to serve as an inverter, the input 176 of the gate 174 in that element is hardwired to a logic high signal such as a positive core logic power supply voltage Vcc, as shown in FIG. 9. When it is desired to use a given element 172 to serve as a short circuit (i.e., a non-inverting path), the input 176 of the gate 174 in that element is hardwired to a logic low signal such as core logic ground signal Vss, as shown in FIG. 10. Adjusting the hardwired connections to the exclusive OR gates 174 does not require extensive layout changes to the pattern detector circuit 150, which facilitates implementation of pattern detector circuit 150 in a wide variety of integrated circuits.

Figure 11:
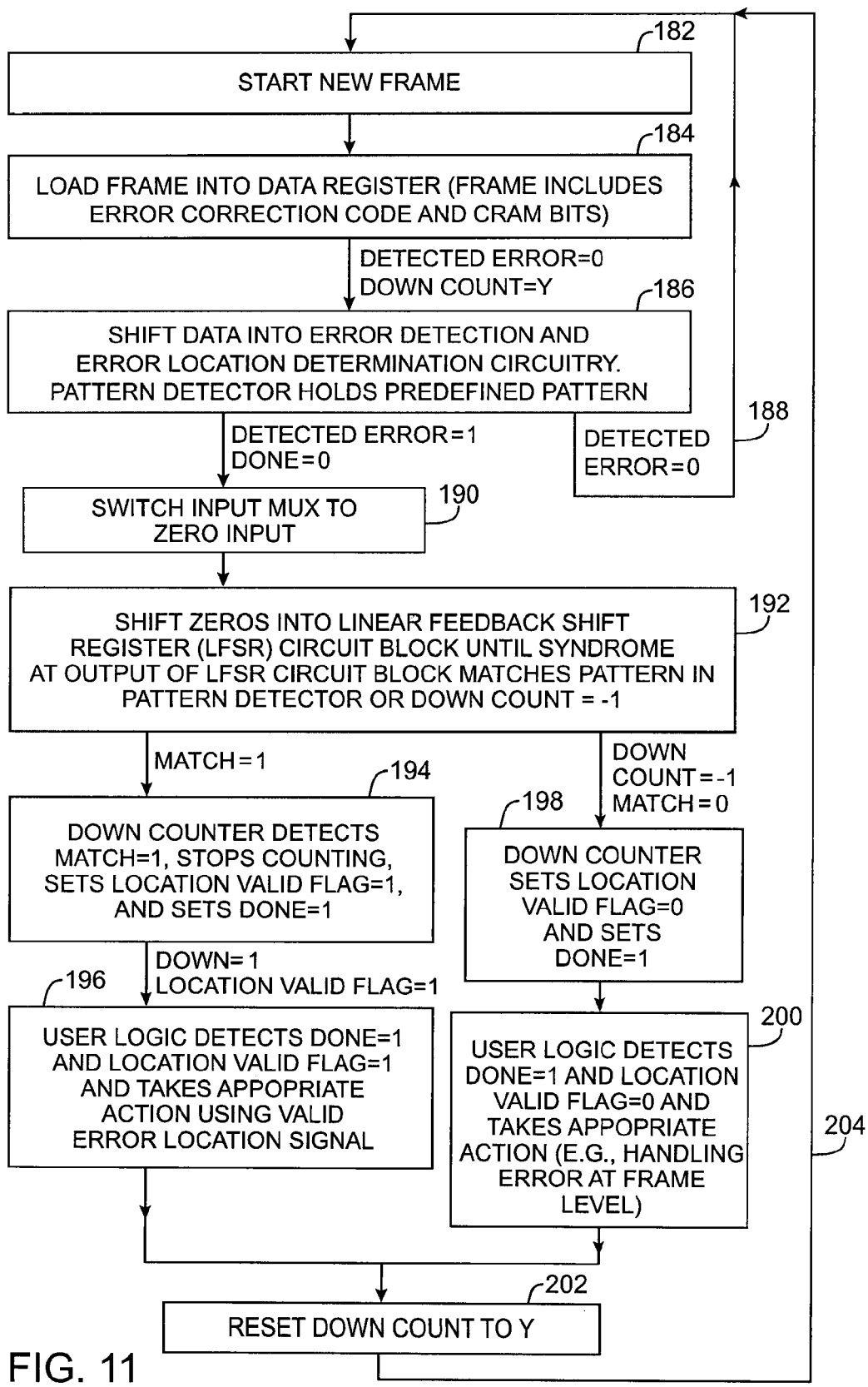
FIG. 11 is a flow chart of illustrative steps involved in using a single-counter circuit in detecting and locating configuration random-access-memory errors on an integrated circuit such as the programmable logic device integrated circuit of FIG. 4 in accordance with the present invention.

Illustrative steps involved in using the circuitry of FIGS. 4 and 5 while operating a programmable logic device 10 are shown in FIG. 11. During the operations of FIG. 11, a programmable logic device 10 that has been loaded with configuration data is used in a system such as the system 38 of FIG. 2. When configuration data was initially loaded into device 10 (e.g., from a configuration device 40 of the type shown in FIG. 2), error detection and error location determination circuitry 102 computed a CRC for each column of configuration data loaded into a column of array 86 (FIG. 4). The column of configuration data in array 86 and the corresponding column of CRC data in array 88 form a column of bits in array 99. Each column of CRC data and configuration data bits form a frame of data bits. During normal operations of device 10, error detection and error location determination circuitry 102 and 106 and additional error-handling circuitry such as user logic 124 are used to monitor the condition of array 99 and locate detected soft errors.

At step 182, processing of a new frame is started. The pattern in which the data of array 99 is processed is controlled by error detection control circuit 106. With one suitable approach, error detection control circuit 106 steps through each column of array 99 in sequence (e.g., processing the first frame in array 99, the second frame in array 99, the third frame in array 99, etc.). Other systematic techniques for processing the frames of array 99 may be used if desired. Error detection control circuit 106 selects each frame by using register 90 to assert an appropriate address signal for array 99. During step 182, the count of the down counter (DOWN COUNT) is initialized (if necessary) to the frame size y. The frame size y equals the number of rows in each column of CRAM array 86 (e.g., 6000) plus the number of rows in each column of ECC RAM array 88 (e.g., 16).

At step 184, the error detection control circuit 106 asserts the shift enable signal S_EN on path 100 to shift the frame of data corresponding to the currently-addressed column of array 99 into the data register 96. The frame of data that is loaded into register 96 includes the column of configuration random-access-memory bits from array 86 and the corresponding column of previously-computed CRC bits in error-correction-code RAM array 88. The column of bits from array 88 is loaded into register 92. The column of bits from array 86 is loaded into register 94. At the completion of step 184, the signal DETECTED ERROR on line 128 is low ("0"). The count of down counter 170 DOWN_COUNT is set to its initial value of y (e.g., 6016).

At step 186, error detection control circuit 106 asserts the shift enable signal S_EN and the frame of data that was loaded into register 96 is shifted into error detection and error location determination circuitry 102 in series. Data flows into circuitry 102 via paths 112 and 114. During these shifting operations, signal BEGIN CRC CHECK CYCLE is low, so signal DETECTED ERROR is low. The low value of the DETECTED ERROR signal directs multiplexer 160 to connect its DATA IN input 114 to the LFSR circuit 136 (FIG. 5). After the frame has been loaded, the BEGIN CRC CHECK CYCLE signal goes high. The syndrome pattern detector 150 holds its predefined pattern $\{u_i\}$. The syndrome s from the output of LFSR circuit 136 is received by OR gate 152.

If the signals $\{s_i\}$ are low when BEGIN CRC CHECK CYCLE goes high, the signal DETECTED ERROR 128 will be low. Because no errors in the frame are detected (in this scenario), processing loops back to step 182 so that the next frame of array 99 can be processed, as indicated by line 188.

If one or more of the signals $\{s_i\}$ is high when BEGIN CRC CHECK CYCLE goes high, the DETECTED ERROR signal on line 128 goes high. In this state, no counting has yet been performed by the down counter 174, so the signal DONE on line 130 is low.

The signal DETECTED ERROR is provided to the control input of multiplexer 160 via path 156 and the enable input 157 of down counter 170. When the signal DETECTED ERROR goes high, multiplexer 160 connects its zero input 162 to its output (step 190). Connecting zero (grounded) input 162 to the input of the LFSR circuit 136 in this way presents logic low to the LFSR circuit.

At step 192, the frame continues to be shifted through the circuitry 102 (i.e., shifted to the right in the orientation of the circuit diagram of FIG. 5). Because a logic low signal is being presented at the input to LFSR circuit 136, a series of zeros are shifted into the LFSR circuit in place of the remainder of the data frame. A count DOWN_COUNT is maintained by the down counter 170 and is decreased by one with each cycle of CLK (i.e., with each one-bit shift in the data passing through LFSR circuit 136). The shifting process continues until the syndrome s at the output of the LFSR circuit 136 matches the pattern in the pattern detector or until the down counter 170 finishes counting down from its initial value (i.e., when the DOWN_COUNT signal maintained by the down counter 170 reaches −1). If the syndrome s matches the predefined pattern $\{u_i\}$ in the pattern detector 150, the pattern detector 150 takes the signal MATCH high (i.e., to "1"). If DOWN_COUNT reaches −1, the signal MATCH remains low (i.e., at "0"). During step 192, down counter 170 monitors the state of the MATCH signal on line 168.

If down counter 170 detects that MATCH has been taken high, the down counter 170 stops counting (step 194). Because MATCH has gone high, the down counter 170 can conclude that a successful match has been obtained. Accordingly, the down counter takes the LOCATION VALID FLAG signal high on output 126 and takes the DONE signal on line 130 high. At the same time, the down counter produces a valid ERROR LOCATION signal on output 132. The ERROR LOCATION signal is a multi-bit signal (e.g., 13 bits) that indicates the location of the detected soft error within the CRAM bits of the frame. As an example, the ERROR LOCATION signal may produce a signal that indicates the detected error is located at bit position number 1463 out of 6000 CRAM bits in the frame. Setting the LOCATION VALID flag to "1" indicates that the signal ERROR LOCATION is valid and can be relied upon (in conjunction with the error location on line 134 of FIG. 4) by error control logic such as user error control logic 124 of FIG. 4.

The user logic monitors the states of the signals DONE and LOCATION VALID FLAG. When the user logic 124 detects that LOCATION VALID FLAG and DONE are both high (step 196), the user logic 124 can conclude that an error has been detected and that its position within the frame has been determined. Error detection control circuit 106 provides information on line 134 specifying the number of the current frame being processed. Taken together, ERROR LOCATION and CURRENT FRAME NUMBER serve as an error location signal that indicates the bit position of the detected soft error within the array 99. During step 196, appropriate corrective actions are taken. For example, error status and control signals may be provided on pins such as pins 122 of FIG. 4 that are monitored and processed by circuitry external to the programmable logic device. These signals may, as an example, initiate the reprogramming of device 10. An advantage of determining the location of the CRAM error is that it is not necessary to reprogram the array 99 each time an error is detected. In situations in which the error does not affect the CRAM bits that are actively being used, the device 10 may be allowed to operate uninterrupted.

If down counter 170 detects that counting has been completed while MATCH remains low (i.e., if DOWN_COUNT is detected as reaching −1), the down counter 170 sets the value of LOCATION VALID FLAG to "0" (step 198). The signal DONE is taken high during step 198 to indicate that processing of the current frame is complete. In this situation, it is not possible to determine the location of the error within the frame, so the signal ERROR LOCATION is not valid.

At step 200, error control logic such as user-implemented error control logic 124 of FIG. 4 detects that the signal DONE is high and that the signal LOCATION VALID FLAG is low and takes appropriate action. Suitable actions include placing a signal on one or more of pins 122 that directs external circuitry to reload the configuration data into the array 86 to correct the detected error, setting a status register bit to a particular value, etc. If desired, the user logic can use the current frame number information provided by error detection control logic 106. For example, the user logic can store the current frame number in a status register or can provide this information to external circuitry via pins 122. Although the frame number by itself is insufficient to provide the bit position of the error within the array 99, the frame number may assist the user logic 124 in determining how to handle the detected error. If, as an example, the frame number corresponds to a portion of array 86 that does not contain actively used CRAM bits, the user logic can decide not to interrupt the operation of the programmable logic device for reprogramming.

At step 202, the down counter value DOWN_COUNT is reset to the size of the frame y (e.g., to 6016). Processing of the next frame continues by looping back to step 182, as indicated by line 204.

The error detection and location operations of FIG. 11 can locate errors in array 99 both in the CRAM portion (array 86) and the ECC RAM portion (array 88).

The error detection and error location determination circuitry 102 of FIG. 4 uses a down counter 170. If desired, error detection and error location determination circuitry 102 may use an up counter in place of a down counter. If an up counter is used, the initial count value is initialized at 0 rather than y.

Figure 12:
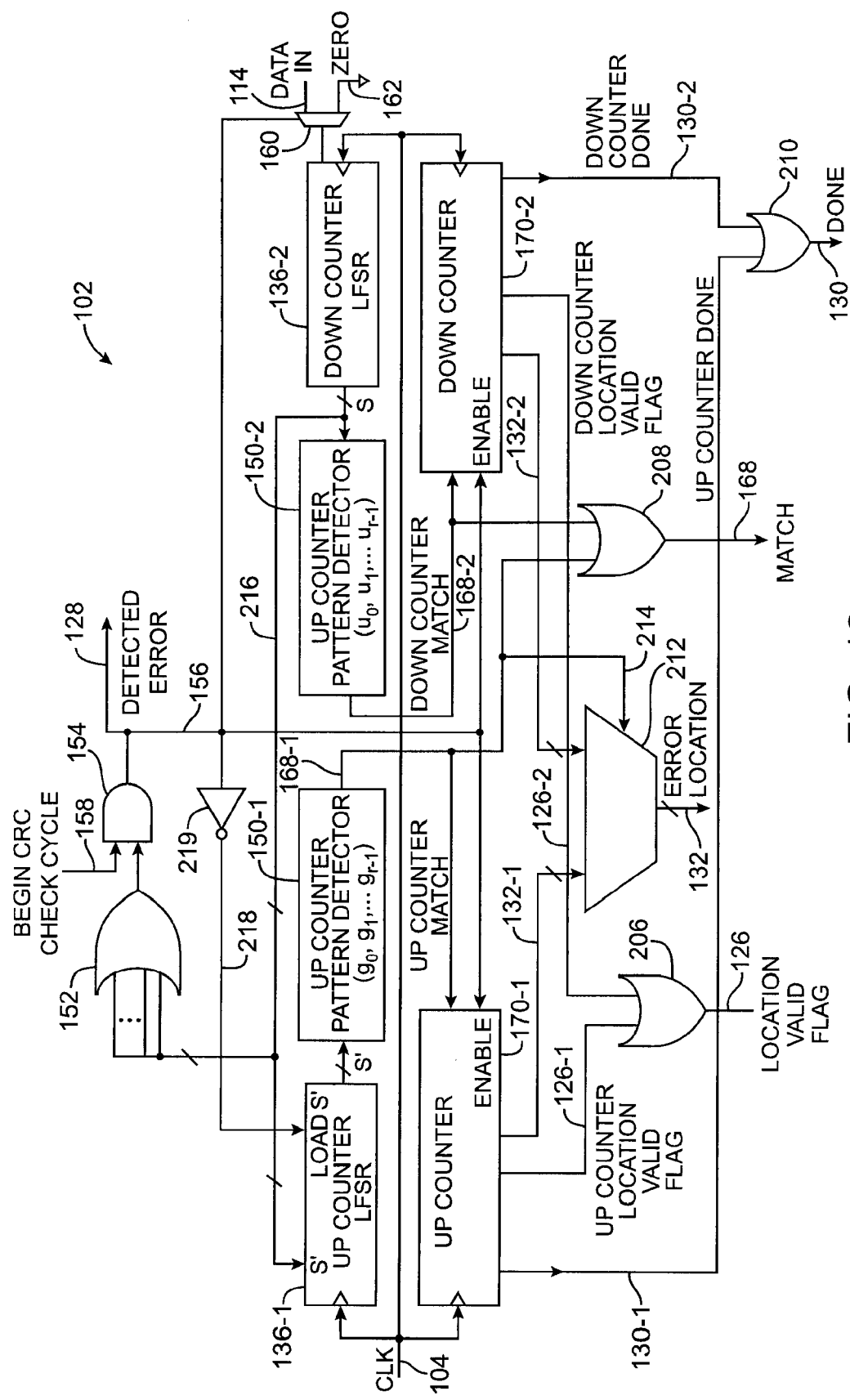
FIG. 12 is a circuit diagram of illustrative dual-counter error detection and error location determination circuitry that may be used in a programmable logic device integrated circuit of the type shown in FIG. 4 in accordance with the present invention.

Moreover, multiple counters may be used in error detection and error location determination circuitry 102 if desired. Illustrative error detection and error location determination circuitry 102 that is based on a dual-counter architecture is shown in FIG. 12. As shown in FIG. 12, error detection and error location determination circuitry 102 contains an up counter 170-1 and a down counter 170-2. Circuitry 102 also contains an up counter LFSR circuit 136-1, down counter LFSR circuit 136-2, up counter pattern detector 150-1, and down counter pattern detector 150-2.

Up counter 170-1 and down counter 170-2 operate in parallel, each processing half of a frame. Up counter 170-1 maintains a count value UP_COUNT while counting the shifting operations in LFSR circuit 136-1 during error detection for a first half of the frame. Down counter 170-2 maintains a count value DOWN_COUNT while counting the shifted bits for a second half of the frame as they are shifted through down counter LFSR circuit 136-2. By operating in parallel on both the first and second halves of each frame, processing time is reduced. Errors can therefore be located more quickly using the error detection and error location determination circuitry of FIG. 12 than with the error detection and error location determination circuitry of FIG. 5.

The up counter 170-1 and down counter 170-2 generate output signals that are provided to the inputs to OR gates 206, 208, and 210.

Gate 206 receives an UP COUNTER LOCATION VALID FLAG signal from up counter 170-1 on path 126-1 and a DOWN COUNTER LOCATION VALID FLAG signal from down counter 170-2 on path 126-2. The output of OR gate 206 is the signal LOCATION VALID FLAG on line 126, which is high if either the UP COUNTER LOCATION VALID FLAG signal or the DOWN COUNTER LOCATION VALID FLAG signal is high.

Gate 208 receives an UP COUNTER MATCH signal from up counter pattern detector 150-1 on path 168-1 and a DOWN COUNTER MATCH signal from down counter pattern detector 150-2 on path 168-2. The output of OR gate 208 is the signal MATCH on line 168.

Gate 210 receives an UP COUNTER DONE signal from up counter 170-1 on path 130-1 and a DOWN COUNTER DONE signal from down counter 170-2 on path 130-2. The output of OR gate 210 is the signal DONE on line 130.

During processing of a frame, frame data (and, if appropriate, zero data from input 162) is provided to down counter LFSR circuit 136-2 via multiplexer 160. A copy s' of the syndrome s from the output of down counter LFSR circuit 136-2 is provided to up counter LFSR circuit 136-1 via path 216. Up counter LFSR circuit 136-1 and down counter LFSR circuit 136-2 operate in parallel on different portions of the frame.

Up counter LFSR circuit 136-1 provides a syndrome output signal s' to up counter pattern detector 150-1. Down counter LFSR circuit 136-2 provides syndrome s to down counter pattern detector 150-2. Pattern detector 150-1 contains a predefined pattern $\{g_0, g_1, g_2, \ldots g_{r-1}\}$ given by the coefficients $\{g_i\}$ of the CRC generator polynomial g(x). Pattern detector 150-2 contains the predefined pattern $\{u_i\}$, as described in connection with FIGS. 7 and 8. It is not known in advance which of the two halves of the frame contains the soft error (if any). It is therefore possible for either up counter pattern detector 150-1 or down counter pattern detector 150-2 to detect an error, depending on the location of the error within the frame. When an error is contained in one portion of the frame, the error will be detected by a match between syndrome s' and the pattern of up counter pattern detector 150-1. When an error is contained in the other portion of the frame; the error will be detected by a match between syndrome s and the pattern of down counter pattern detector 150-2.

If the error is detected by up counter pattern detector 150-1, up counter pattern detector 150-1 takes the UP COUNTER MATCH signal high to stop up counter 170-1. In response, the up counter 170-1 will generate a valid UP COUNTER ERROR LOCATION signal on line 132-1. If, however, the error is detected by down counter pattern detector 150-2, down counter pattern detector 150-1 takes the DOWN COUNTER MATCH signal high to stop down counter 170-2. When the DOWN COUNTER MATCH signal goes high, the down counter 170-2 provides a valid DOWN COUNTER ERROR LOCATION signal on line 132-2. Multiplexer 212 receives UP COUNTER ERROR LOCATION signals on line 132-1 and DOWN COUNTER ERROR LOCATION signals on line 132-2. Control input 214 receives the UP COUNTER MATCH signal from up counter pattern detector 150-1. When the UP COUNTER MATCH signal is high, multiplexer 212 connects input 132-1 to output 132, so that the UP COUNTER ERROR LOCATION signal is routed to output 132 for use as the ERROR LOCATION signal. When the UP COUNTER MATCH signal is low, multiplexer 212 connects input 132-2 to output 132, so that the DOWN COUNTER ERROR LOCATION signal is routed to output 132 for use as the ERROR LOCATION signal.

Figure 13:
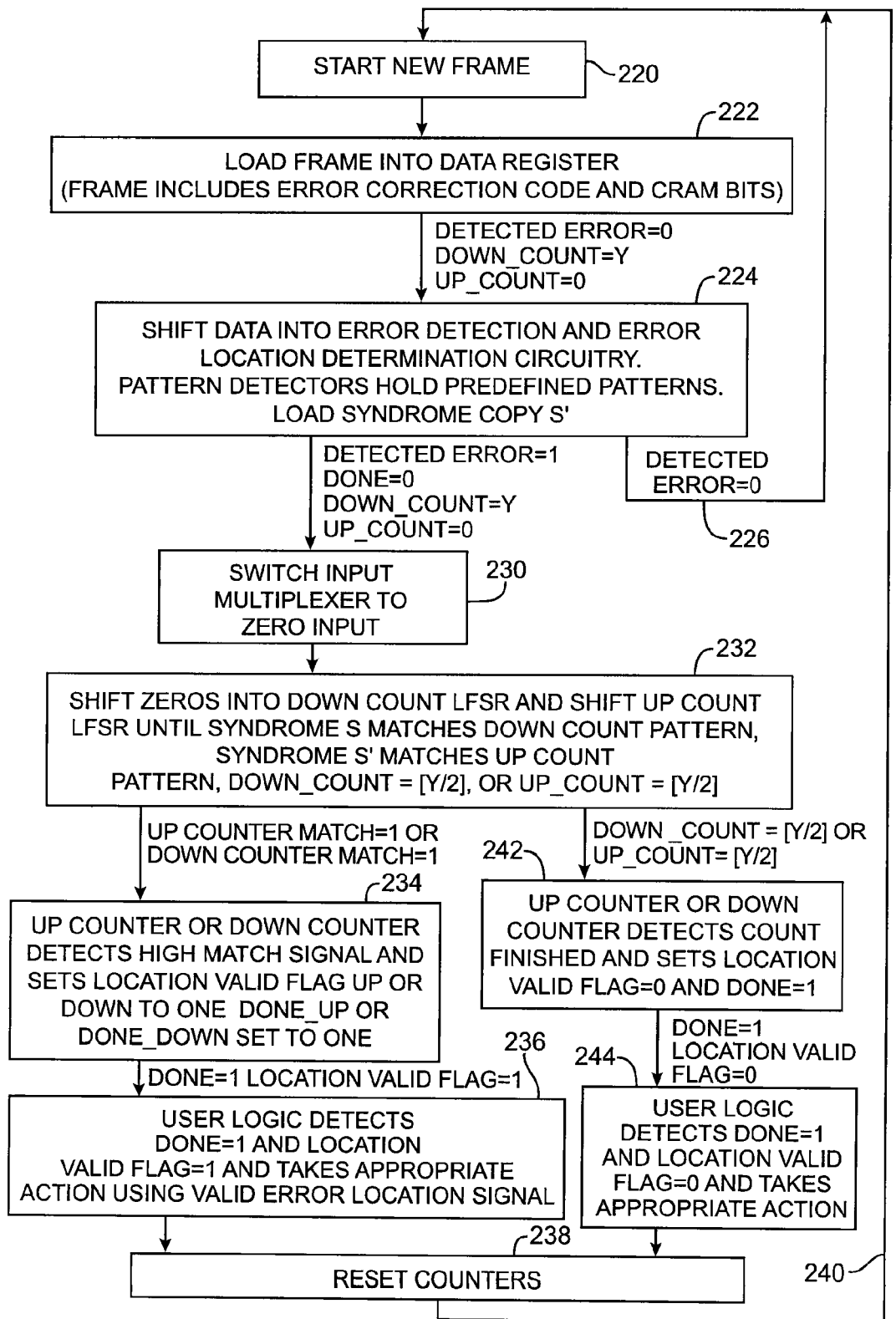
FIG. 13 is a flow chart of illustrative steps involved in using a dual-counter circuit in detecting and locating configuration random-access-memory errors on an integrated circuit such as the programmable logic device integrated circuit of FIG. 4 in accordance with the present invention.

Illustrative steps involved in using the error detection and error location determination circuitry 102 of FIG. 12 are shown in FIG. 13.

At step 220, processing of a new frame is started. Error detection control circuitry 106 asserts the appropriate address signal ADD to address the desired frame in array 99. If necessary, the counts of the up counter (UP COUNT) and the down counter (DOWN COUNT) are initialized. The value of UP_COUNT is initialized at 0 and the value of DOWN_COUNT is initialized at the frame size y (the number of rows in array 99 including both the CRAM array rows).

At step 222, the error detection control circuit 106 asserts the shift enable signal S_EN on path 100 to shift the frame of data corresponding to the addressed column of array 99 into the data register 96. The value of the DETECTED ERROR on lines 156 and 128 is low.

At step 224, error detection control circuit 106 asserts the shift enable signal S_EN and the frame of data that was loaded into register 96 is serially shifted into the error detection and error location determination circuitry 102. The low value of the DETECTED ERROR signal directs multiplexer 160 to route the signals on its DATA IN input 114 to the LFSR circuit 136-2 (FIG. 12).

After shifting of the frame into the circuitry 102, the signal BEGIN CRC CHECK CYCLE on line 158 is taken high to enable gate 154. The syndrome s from the output of LFSR circuit 136-2 is received by OR gate 152. The low DETECTED ENABLE SIGNAL is inverted by inverter 219 (FIG. 12), so the load enable input of up counter LFSR circuit 136-1 receives a high signal. This allows a copy s' of the syndrome to be loaded into up counter LFSR circuit. If the signals $\{s_i\}$ remain low during subsequent clock cycles, the signal DETECTED ERROR 128 remains low. In this situation, no errors are detected in the frame, so processing loops back to step 182, as indicated by line 188.

If one or more of the signals $\{s_i\}$ goes high while data is being shifted through LFSR circuit 136-2, the output of OR gate 152 and the DETECTED ERROR signal on line 156 goes high, enabling counters 170-1 and 170-2. In this state, processing of the frame is not yet complete, so the signals DOWN COUNTER DONE and UP COUNTER DONE on lines 130-2 and 130-1, respectively, and the signal DONE on line 130 are low.

The signal DETECTED ERROR is provided to the control input of multiplexer 160. When the signal DETECTED ERROR goes high, multiplexer 160 connects its zero input 162 to its output (step 230).

At step 232, data continues to be shifted through the up counter LFSR circuit 136-1 and the down counter LFSR circuit 136-1. During these shifting operations, the down counter LFSR circuit 136-2 receives a series of zeros from input 162. Each clock cycle the down counter LFSR circuit 136-2 shifts its contents and the down counter 170-2 decrements its count value DOWN_COUNT by one. At the same time, the up counter LFSR circuit 136-1 shifts its contents and the up counter 170-1 increments its count value UP_COUNT by one. The resulting output signals s' from up counter LFSR 136-1 are continuously compared to the predefined pattern maintained by up counter pattern detector 150-1. Similarly, down counter pattern detector 150-2 continuously compares the syndrome s from down counter LFSR circuit 136-2 to the predefined pattern maintained by down counter pattern detector 150-2. Shifting continues during step 232 until a match is detected by up counter pattern detector 150-1, a match is detected by down counter pattern detector 150-2, the value of DOWN_COUNT reaches [y/2] or the value of UP_COUNT reaches [y/2].

If pattern detector 150-1 detects a match or if pattern detector 150-2 detects a match, the signal UP COUNTER MATCH or DOWN COUNTER MATCH is taken high, respectively. At step 234, the up counter 170-1 or the down counter 170-2 detects the high match signal and sets its LOCATION VALID FLAG to one. The appropriate DONE signal is also set to one.

At step 236, circuitry such as user error control logic 124 (FIG. 4) detects that DONE is equal to one and LOCATION VALID FLAG is equal to one and concludes that processing is complete and an error has been located. A valid ERROR LOCATION signal is presented at the output of multiplexer 212. The error control logic uses the valid error location information to take an appropriate response, as described in connection with FIG. 11.

If no match is detected before one of the counters finishes, the up counter or down counter detects that the count has finished at step 242 and sets its signal DONE to zero. The values of the UP COUNTER LOCATION VALID FLAG and the DOWN COUNTER LOCATION VALID FLAG are zero, indicating that it was not possible to determine the location of the soft error within the frame.

At step 244, error handling logic such as user logic 124 of FIG. 4 takes appropriate actions, as described in connection with FIG. 11.

The values of UP_COUNT and DOWN_COUNT are reset at step 238, before processing loops back to step 220, as indicated by line 240.

The foregoing is merely illustrative of the principles of this invention and various modifications can be made by those skilled in the art without departing from the scope and spirit of the invention.

What is claimed is:

1. A programmable integrated circuit comprising:
    an array of configuration random-access-memory cells loaded with configuration data;
    an array of error-correcting-code random-access-memory cells each column of which contains error correction check bits for a respective column in the array of configuration random-access-memory cells; and
    error detection and error location determination circuitry having an input that receives data from the arrays, linear feedback shift register circuitry that processes the received data, and an error location signal output on which an error location signal is provided that indicates where a soft error is located within the arrays.

2. The programmable integrated circuit defined in claim 1 wherein the error detection and error location determination circuitry contains counter circuitry that provides the error location signal to the error location signal output.

3. The programmable integrated circuit defined in claim 1 wherein the error detection and error location determination circuitry contains pattern detector circuitry that receives a plurality of output signals from the linear feedback shift register circuitry.

4. The programmable integrated circuit defined in claim 1 wherein the error location signal output comprises multiple parallel lines and conveys a multi-bit error location signal.

5. The programmable integrated circuit defined in claim 1 wherein the linear feedback shift register circuitry comprises first and second linear feedback shift register circuits and wherein the error detection and error location determination circuitry comprises first and second corresponding pattern detectors and first and second counters that maintain clock cycle counts as the data is shifted through the first and second linear feedback shift registers.

6. The programmable integrated circuit defined in claim 1 wherein the error detection and error location determination circuitry comprises:
   a syndrome pattern detector that receives a syndrome from the linear feedback shift register circuitry and that provides a corresponding output signal; and
   a counter that receives the output signal from the syndrome pattern detector, wherein the counter stops counting in response to a change in the output signal from the syndrome pattern detector.

7. The programmable integrated circuit defined in claim 1 wherein the linear feedback shift register circuitry contains a plurality of registers and logic gates that perform cyclic redundancy check operations on the data from the arrays.

8. The programmable integrated circuit defined in claim 1 wherein the linear feedback shift register circuitry contains a plurality of registers and associated exclusive OR gates that perform cyclic redundancy check operations on the data from the arrays.

9. The programmable integrated circuit defined in claim 1 wherein the error detection and error location determination circuitry comprises:
   a syndrome pattern detector that receives syndrome signals from the linear feedback shift register circuitry and that provides a corresponding output signal, wherein the syndrome pattern detector comprises an OR gate with a plurality of input paths that receive the syndrome signals, wherein some of the input paths are short circuits and some of the input paths contain inverters.

10. The programmable integrated circuit defined in claim 1 wherein the error detection and error location determination circuitry comprises:
    a syndrome pattern detector that receives syndrome signals from the linear feedback shift register circuitry and that provides a corresponding output signal, wherein the syndrome pattern detector comprises an OR gate with a plurality of input paths that receive the syndrome signals, wherein each input path contains an exclusive OR gate that has a first input that receives a respective one of the syndrome signals and a second input that receives a hardwired power supply signal.

11. A method of monitoring a programmable integrated circuit for soft memory cell errors due to radiation strikes, comprising:
    loading columns of configuration data into columns of memory cells in an array of configuration random-access-memory cells on the programmable integrated circuit and corresponding cyclic redundancy check error correction check bits into corresponding columns of memory cells in an array of error-correction-code random-access-memory cells on the programmable integrated circuit; and
    using error detection and error location determination circuitry that contains linear feedback shift register circuitry in processing frames of data from the memory cells to determine the location of a soft memory cell error within the memory cells, each frame including a given column of configuration data from the array of configuration random-access-memory cells and a given corresponding column of cyclic redundancy check data from the array of error-correction-code random-access-memory cells.

12. The method defined in claim 11 wherein using the error detection and error location determination circuitry comprises monitoring output signals from the linear feedback shift register circuitry with a pattern detector.

13. The method defined in claim 11 wherein using the error detection and error location determination circuitry comprises maintaining a clock cycle count with a counter while shifting the data through the linear feedback shift register.

14. The method defined in claim 11 wherein using the error detection and error location determination circuitry comprises:
    using counter circuitry to maintain a count of clock cycles used to shift the data through the linear feedback shift register;
    using pattern detection circuitry to monitor syndrome signals from the linear feedback shift register circuitry; and
    generating a control signal with the pattern detection circuitry that stops the counter circuitry.

15. The method defined in claim 11 wherein using the error detection and error location determination circuitry comprises:
    using at least one logic gate to generate a control signal that directs a multiplexer to shift either the frame of data into the linear feedback shift register or to shift zeros into the linear feedback shift register.

16. The method defined in claim 11 wherein using the error detection and error location determination circuitry comprises:
    using at least one logic gate to generate a control signal that directs a multiplexer to shift either the frame of data into the linear feedback shift register or to shift zeros into the linear feedback shift register;
    using counter circuitry to maintain a count of clock cycles used to shift the data through the linear feedback shift register;
    using pattern detection circuitry to monitor syndrome signals from the linear feedback shift register circuitry; and
    generating a control signal with the pattern detection circuitry that stops the counter circuitry.

17. Error detection and error location determination circuitry on a programmable integrated circuit containing an array of random-access-memory cells, wherein the array contains rows and columns, wherein some of the random-access-memory cells contain configuration data and provide static output signals for controlling programmable logic on the programmable integrated circuit and wherein some of the random-access-memory cells contain cyclic redundancy check data, each column of the array containing a frame of data, the circuitry comprising:
    a linear feedback shift register having an input that receives the data in each frame, a feedback path, and a plurality of syndrome signal output paths each of which conveys a syndrome signal produced by the linear feedback shift register when processing a given frame;
    a syndrome pattern detector that receives the syndrome signals on the syndrome signal output paths and that compares the syndrome signals to a predetermined pattern; and
    counter circuitry that counts clock cycles as each frame of data is shifted through the linear feedback shift register.

18. The error detection and error location determination circuitry defined in claim 17 wherein the counter circuitry comprises an input that receives a control signal from the syndrome pattern detector, wherein when the syndrome pattern detector detects a match between the received syndrome signals and the predetermined pattern, the control signal is asserted to stop the counter circuitry from counting.

19. The error detection and error location determination circuitry defined in claim 17 wherein the counter circuitry comprises an input that receives a control signal from the syndrome pattern detector, wherein when the syndrome pattern detector detects a match between the received syndrome signals and the predetermined pattern, the control signal is asserted to stop the counter circuitry from counting, and wherein the counter has a multi-bit error location output path on which the counter provides a location signal indicative of which row in the array contains a detected soft error.

20. The error detection and error location determination circuitry defined in claim 17 wherein the counter circuitry comprises an input that receives a control signal from the syndrome pattern detector, wherein when the syndrome pattern detector detects a match between the received syndrome signals and the predetermined pattern, the control signal is asserted to stop the counter circuitry from counting, wherein the counter has a multi-bit error location output path on which the counter provides a location signal indicative of which row in the array contains a detected soft error, and wherein the error detection and error location determination circuitry comprises error detection control circuitry that produces frame number information indicating which column of the array contains the detected soft error.

* * * * *

UNITED STATES PATENT AND TRADEMARK OFFICE
CERTIFICATE OF CORRECTION

PATENT NO. : 7,634,713 B1 Page 1 of 1
APPLICATION NO. : 11/435467
DATED : December 15, 2009
INVENTOR(S) : Ninh D. Ngo It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 869 days.

Signed and Sealed this

Twenty-first Day of December, 2010

David J. Kappos
*Director of the United States Patent and Trademark Office*